US012547085B2

(12) United States Patent
Nefzi et al.

(10) Patent No.: US 12,547,085 B2
(45) Date of Patent: Feb. 10, 2026

(54) SYSTEM AND PROJECTION EXPOSURE APPARATUS

(71) Applicant: Carl Zeiss SMT GmbH, Oberkochen (DE)

(72) Inventors: Marwene Nefzi, Ulm (DE); Jens Kugler, Aalen (DE)

(73) Assignee: Carl Zeiss SMT GmbH, Oberkochen (DE)

(*) Notice: Subject to any disclaimer, the term of this patent is extended or adjusted under 35 U.S.C. 154(b) by 203 days.

(21) Appl. No.: 18/365,479

(22) Filed: Aug. 4, 2023

(65) Prior Publication Data

US 2023/0408934 A1 Dec. 21, 2023

Related U.S. Application Data

(63) Continuation of application No. PCT/EP2022/052742, filed on Feb. 4, 2022.

(30) Foreign Application Priority Data

Feb. 9, 2021 (DE) ......................... 102021201203.5

(51) Int. Cl.
*G03F 7/20* (2006.01)
*F16F 15/03* (2006.01)
(Continued)

(52) U.S. Cl.
CPC .............. *G03F 7/709* (2013.01); *F16F 15/03* (2013.01); *F16F 15/046* (2013.01);
(Continued)

(58) Field of Classification Search
CPC .. G03F 7/709; G03F 7/70825; G03F 7/70075; F16F 15/03; F16F 15/046;
(Continued)

(56) References Cited

U.S. PATENT DOCUMENTS 6,573,978 B1 6/2003 McGuire, Jr.
11,169,445 B2 11/2021 Bieling et al.
(Continued)

FOREIGN PATENT DOCUMENTS

DE 10 2008 009 600 A1 8/2009
DE 10 2012 220 925 A1 11/2013
(Continued)

OTHER PUBLICATIONS

Translation of International Search Report for corresponding PCT Appl No. PCT/EP2022/052742, dated May 30, 2022.

*Primary Examiner* — Mesfin T Asfaw
(74) *Attorney, Agent, or Firm* — Fish & Richardson P.C.

(57) ABSTRACT

A system for a projection exposure apparatus which comprises a first component, a second component, and a decoupling device configured to decouple the second component in more than one degree of freedom from mechanical excitations of the first component. The decoupling device comprises first decoupling elements which have a positive stiffness. The decoupling device also comprises second decoupling elements, which have a negative stiffness. The decoupling device further comprises a third component, which is arranged between the first and second components.

20 Claims, 10 Drawing Sheets

1 2 3 4 5 6 7 8 9 10 11 12 13 14 15 16 17 18 19 20 21 22 23 M1 M2 M3 M4 M5 M6 z y x

(51) Int. Cl.
*F16F 15/04* (2006.01)
*G03F 7/00* (2006.01)

(52) U.S. Cl.
CPC ..... *F16F 2222/06* (2013.01); *F16F 2228/063* (2013.01); *F16F 2228/08* (2013.01)

(58) Field of Classification Search
CPC ............. F16F 2222/06; F16F 2228/063; F16F 2228/08; G02B 7/1828; G02B 26/0816
See application file for complete search history.

(56) References Cited

U.S. PATENT DOCUMENTS

| | | | |
|---|---|---|---|
| 2003/0155882 A1 | 8/2003 | Ono et al. | |
| 2006/0060791 A1 | 3/2006 | Hazelton | |
| 2006/0132747 A1 | 6/2006 | Singer et al. | |
| 2008/0068568 A1* | 3/2008 | Ebihara | G03F 7/70808 355/53 |
| 2017/0261859 A1 | 9/2017 | Hauf et al. | |
| 2018/0074303 A1 | 3/2018 | Schwab | |

FOREIGN PATENT DOCUMENTS

| | | |
|---|---|---|
| DE | 10 2012 221 831 A1 | 6/2014 |
| DE | 10 2015 210 484 A1 | 6/2016 |
| DE | 10 2017 220 586 A1 | 5/2019 |
| EP | 1 614 008 B1 | 12/2009 |

* cited by examiner

SYSTEM AND PROJECTION EXPOSURE APPARATUS

CROSS-REFERENCE TO RELATED APPLICATIONS

The present application is a continuation of, and claims benefit under 35 USC 120 to, international application PCT/EP2022/052742, filed Feb. 4, 2022, which claims benefit under 35 USC 119 of German Application No 10 2021 201 203.5, filed Feb. 9, 2021. The entire disclosure of each these applications is incorporated by reference herein.

FIELD

The present disclosure relates to a system for a projection exposure apparatus and to a projection exposure apparatus comprising such a system.

BACKGROUND

Microlithography is used for the production of microstructured component parts, for example integrated circuits. The microlithography process is carried out using a lithography apparatus, which has an illumination system and a projection system. The image of a mask (reticle) illuminated via the illumination system is projected via the projection system onto a substrate, for example a silicon wafer, which is coated with a light-sensitive layer (photoresist) and arranged in the image plane of the projection system, in order to transfer the mask structure to the light-sensitive coating of the substrate.

Driven by the desire for ever smaller structures in the production of integrated circuits, currently under development are EUV lithography apparatuses (extreme ultraviolet, EUV) that use light with a wavelength in the range of 0.1 nm to 30 nm, for example 13.5 nm. In the case of such EUV lithography apparatuses, because of the high absorption of light of this wavelength by most materials, reflective optical units, that is to say minors, in general are used instead of—as previously—refractive optical units, that is to say lens elements.

The general demand for a high numerical aperture is resulting in larger optical units and thus in larger projection systems that become sensitive to mechanical excitations. Soft vibration isolators are therefore sometimes used. Larger masses, however, generally involve stiff springs so that the deflection resulting from the weight does not cause high stresses. These contradictory factors can make the design of classic spring systems very challenging.

SUMMARY The present disclosure seeks to provide an improved system for a projection exposure apparatus.

Accordingly, a system for a projection exposure apparatus is proposed. The system comprises a first component, a second component, and a decoupling device, which is designed to decouple the second component from mechanical excitations of the first component in more than one degree of freedom, wherein the decoupling device comprises first decoupling elements, which have a positive stiffness, and second decoupling elements, which have a negative stiffness, and wherein the decoupling device comprises a third component which is arranged between the first component and the second component.

Owing at least partially to the first decoupling elements being provided with the positive stiffness and the second decoupling elements with the negative stiffness, it is possible to achieve a zero stiffness about the respective degree of freedom. This can allow a low decoupling frequency even in the event of a larger mass.

The components can be any component parts of the system. For example, the first component is a force frame of the projection exposure apparatus, and the second component is a sensor frame of the projection exposure apparatus. The first component may therefore also be referred to as a force frame. The second component may accordingly be referred to as a sensor frame.

However, one of the components may also be an optical element or the like. In principle, the system can comprise any component parts or frames. The system can be a projection system or a projection optical unit of the projection exposure apparatus or a part of a projection system. However, the system may also an illumination system or part of an illumination system. The system may be an optical system or may be referred to as an optical system.

The fact that the decoupling device is designed to "decouple" the second component from the first component means here in particular that the decoupling device is designed to prevent movements, such as vibrations, which act on the first component, from being transmitted to the second component.

A coordinate system having a first spatial direction or x-direction, a second spatial direction or y-direction and a third spatial direction or z-direction can be assigned to the system. The first spatial direction may also be referred to as a depth direction. The second spatial direction may also be referred to as a width direction or horizontal direction. The third spatial direction may also be referred to as a vertical direction.

Six degrees of freedom are assigned to the coordinate system, with one linear or translational degree of freedom being provided along or counter to each one of the aforementioned spatial directions. This results in three translational degrees of freedom. Furthermore, one rotational degree of freedom, i.e. a rotation, is provided about each spatial direction. This results in three rotational degrees of freedom. A total of six degrees of freedom are therefore provided.

The decoupling device can be designed here to allow decoupling of the second component from the first component, not in precisely one, but rather in more than one degree of freedom, that is, in at least two degrees of freedom. For example, these two degrees of freedom can be a translational degree of freedom and a rotational degree of freedom. In the translational degree of freedom, for example, the first component is moved translationally relative to the second component by a mechanical excitation from the outside. The mechanical excitations can be vibrations acting on the first component. In the rotational degree of freedom, the first component, for example, performs a tilting or rotational movement with respect to the second component.

The fact that the first decoupling elements have a "positive" stiffness should be understood here as meaning that the first decoupling elements generate a force in the event of a deformation or deflection of same, which counteracts the deformation or the deflection. For example, a helical spring which is elongated generates a force which counteracts the change in length.

In contrast, a "negative" stiffness is understood to mean the property that the second decoupling elements produce a force which acts in the direction of the deformation or deflection when they are deformed or deflected. For example, a pretensioned compression spring has such a negative stiffness. In the case of an elongation of such a pretensioned compression spring, the latter generates a force which acts in the direction of the change in length. Pretensioned leaf springs or two magnetic elements facing each other either with their south poles or north poles also have a negative stiffness. The negative stiffness and the positive stiffness cancel each other out for example, and therefore the decoupling device has a zero stiffness.

According to an embodiment, the decoupling device is designed to decouple the second component from mechanical excitations of the first component in six degrees of freedom.

The decoupling device may also be designed to decouple the second component from mechanical excitations of the first component only in three, four or five degrees of freedom. However, the decoupling device is suitable for decoupling of at least two degrees of freedom.

According to an embodiment, the first decoupling elements are spring elements, wherein the second decoupling elements are magnetic elements or pretensioned spring elements.

The first decoupling elements can be, for example, helical springs, leaf springs or leaf spring packages. For example, the first decoupling elements are compression springs. The second decoupling elements are, for example, magnetic elements in the form of permanent magnets. Alternatively, the second decoupling elements may also be pretensioned helical springs, disk springs or disk spring packages. The second decoupling elements can be pretensioned helical springs. “Pretensioned” means that the spring elements are mounted with pretensioning. In the case of pretensioned compression springs, for example, the latter are compressed.

According to an embodiment, the second decoupling elements are arranged in pairs.

For example, the second decoupling elements are arranged in pairs whenever they are in the form of magnetic elements. It can be the case that two magnetic elements are always combined here to form a pair of magnetic elements. The magnetic elements of a pair of magnetic elements can be arranged in such a way that either their north poles or their south poles are arranged facing each other, and therefore the magnetic elements of a pair of magnetic elements repel each other. An air gap can be accordingly arranged between the magnetic elements of a pair of magnetic elements.

The decoupling device can comprise a third component, which is arranged between the first component and the second component.

The third component may also be referred to as an intermediate component or an intermediate frame. The third component can be operatively connected to the first component, with the second component being operatively connected to the third component.

According to an embodiment, the first decoupling elements and the second decoupling elements are arranged between the first component and the third component.

The first decoupling elements, which are in the form of spring elements, can be arranged in such a way that they are oriented along the third spatial direction or z-direction. For example, four first decoupling elements which are placed at corners of the third component are provided. The first decoupling elements can be placed here between the third component and horizontally arranged arm sections of the first component.

The second decoupling elements, if they are in the form of magnetic elements, can be arranged in such a way that the pairs of magnetic elements of one pair of magnetic elements repel each other, as viewed along the second spatial direction or y-direction. The pairs of magnetic elements can be placed on both sides of the third component, as viewed along the second spatial direction. One magnetic element of each pair of magnetic elements can be firmly connected to the first component. In the event that the second decoupling elements are pretensioned spring elements, it can be the case that the spring elements are coupled to the third component via compression rods. The compression rods can be connected to the third component, on the one hand, and to the respective pretensioned spring element, on the other hand, via flexures.

In an undeflected state of the first component or the third component, the second decoupling elements can be in a state of equilibrium. That is to say, the second decoupling elements, which are arranged on both sides of the third component, generate forces which act only in the second spatial direction or y-direction and cancel each other out, since the pairs of magnetic elements are arranged on both sides of the third component.

As soon as the second decoupling elements pass out of the state of equilibrium, for example in the case of a vibration-related deflection of the first component relative to the third component, the second decoupling elements apply forces to the third component, which act against forces applied by the first coupling elements to the third component. The forces of the first decoupling elements and of the second coupling elements can cancel each other out, and therefore a force-free deflection of the third component relative to the first component and vice versa is possible.

According to an embodiment, the second component is suspended on the third component via third decoupling elements, which cause a decoupling of the second component from the third component in a horizontal direction.

The horizontal direction corresponds, as previously mentioned, to the second spatial direction or the y-direction. “Suspended” in this case means in particular that the decoupling elements can only transmit tensile forces, rather than any compressive forces.

For example, the third decoupling elements transmit a weight force of the second component to the third component.

According to an embodiment, the third decoupling elements are tension cables.

The tension cables can be arranged in the manner of a parallelogram. For example, at least three tension cables are provided. Four tension cables may also be provided. The tension cables can be steel cables or plastic cables, for example. Chains may also act as tension cables.

According to an embodiment, the third decoupling elements are tension rods, wherein the third decoupling elements have a positive stiffness.

The third decoupling elements can each be connected to the second component and the third component via flexures.

According to an embodiment, the system further comprises fourth decoupling elements, which are arranged in each case between the second component and the third component and between the second component and the first component, wherein the fourth decoupling elements have a negative stiffness.

The tension rods may transmit small transverse forces in the horizontal direction. The fourth decoupling elements are provided to compensate for them. Owing to the fact that the third decoupling elements have a positive stiffness and the fourth decoupling elements have a negative stiffness, a zero stiffness can arise along the horizontal direction or y-direction. It is therefore also possible to sufficiently decouple the second component from the first component in the horizontal direction.

According to an embodiment, the fourth decoupling elements are magnetic elements. The magnetic elements can be arranged in pairs in pairs of magnetic elements. It can be the case that the magnetic elements of a pair of magnetic elements are arranged in such a way that either their south poles or their north poles are arranged opposite each other, and therefore the magnetic elements of the respective pair of magnetic elements repel each other. For example, a pair of magnetic elements is arranged between the second component and the third component, as viewed along the z-direction. A second pair of magnetic elements can be placed between the second component and the first component, as viewed along the z-direction.

According to an embodiment, the system further comprises a fourth component, which is arranged between the first component and the fourth decoupling elements, which are arranged between the second component and the first component, wherein the fourth component is decoupled from the first component via of fifth decoupling elements.

Using the fifth decoupling elements, it is therefore possible to prevent excitations of the first component from being applied to that fourth decoupling element which is assigned to the first component. For example, the fourth component may be plate-like. Four fifth decoupling elements which support the fourth component on the first component can be provided.

According to an embodiment, the fifth decoupling elements are spring elements.

The fifth decoupling elements can compression springs. Particularly soft spring elements can be used for the fifth decoupling elements.

According to an embodiment, the first decoupling elements are designed, upon their deflection, to apply first forces to the third component, which forces are oriented counter to a deflection direction of the first decoupling elements, wherein the second decoupling elements are designed, upon their deflection, to apply second forces to the third component, which forces are oriented in a deflection direction of the second decoupling elements, and wherein the first forces and the second forces cancel one other out such that the third component can be deflected without force.

The third component can be deflected relative to the first component in that the first component, for example due to vibration, moves and/or tilts relative to the third component. As previously mentioned, the second decoupling elements can be initially in a state of equilibrium, in which they apply forces to the third component that act along the y-direction and are oriented in the opposite direction. The forces cancel each other out. As soon as the third component is deflected, for example by rotating the first component in relation to the third component, the second decoupling elements pass out of their position of equilibrium, as a result of which they apply obliquely oriented forces to the third component, which forces can be broken down into a horizontal force component and into a vertical force component. When the first component is deflected, the first decoupling elements are also deformed, and therefore they also apply forces to the third component. The forces of the first decoupling elements generally always act along the z-direction. These forces applied by the first decoupling elements act counter to the vertical force components of the forces applied by the second decoupling elements. The vertical force components and the forces applied by the first decoupling elements can cancel each other out. Furthermore, the horizontal force components of the obliquely acting forces of the second decoupling elements also cancel each other out. This provides the force-free deflectability of the third component.

Furthermore, a projection exposure apparatus having at least one system of this type is proposed.

The projection exposure apparatus may be an EUV lithography apparatus or a DUV lithography apparatus. EUV stands for "extreme ultraviolet" and refers to a wavelength of the working light of between 0.1 nm and 30 nm. DUV stands for "deep ultraviolet" and refers to a wavelength of the working light of between 30 nm and 250 nm.

"A" or "an" or "one" in the present case should not necessarily be understood to be restrictive to exactly one element. Instead, a plurality of elements, for example two, three or more, may also be provided. Nor should any other numeral used here be understood to the effect that there is a restriction to exactly the stated number of elements. Instead, unless indicated otherwise, numerical deviations upward and downward are possible.

The embodiments and features described for the system apply correspondingly to the proposed projection exposure apparatus, and vice versa.

Further possible implementations of the disclosure also include combinations, not mentioned explicitly, of features or embodiments described above or hereinafter with respect to the exemplary embodiments. In this case, a person skilled in the art will also add individual aspects as improvements or supplementations to the respective basic form of the disclosure.

Further configurations and aspects of the disclosure are the subject of the dependent claims and also of the exemplary embodiments of the disclosure that are described hereinafter. The disclosure is explained in detail hereinafter on the basis of embodiments with reference to the appended figures.

DETAILED DESCRIPTION

Identical elements or elements having an identical function have been provided with the same reference signs in the figures, unless indicated to the contrary. It should also be noted that the illustrations in the figures are not necessarily true to scale.

Figure 1:
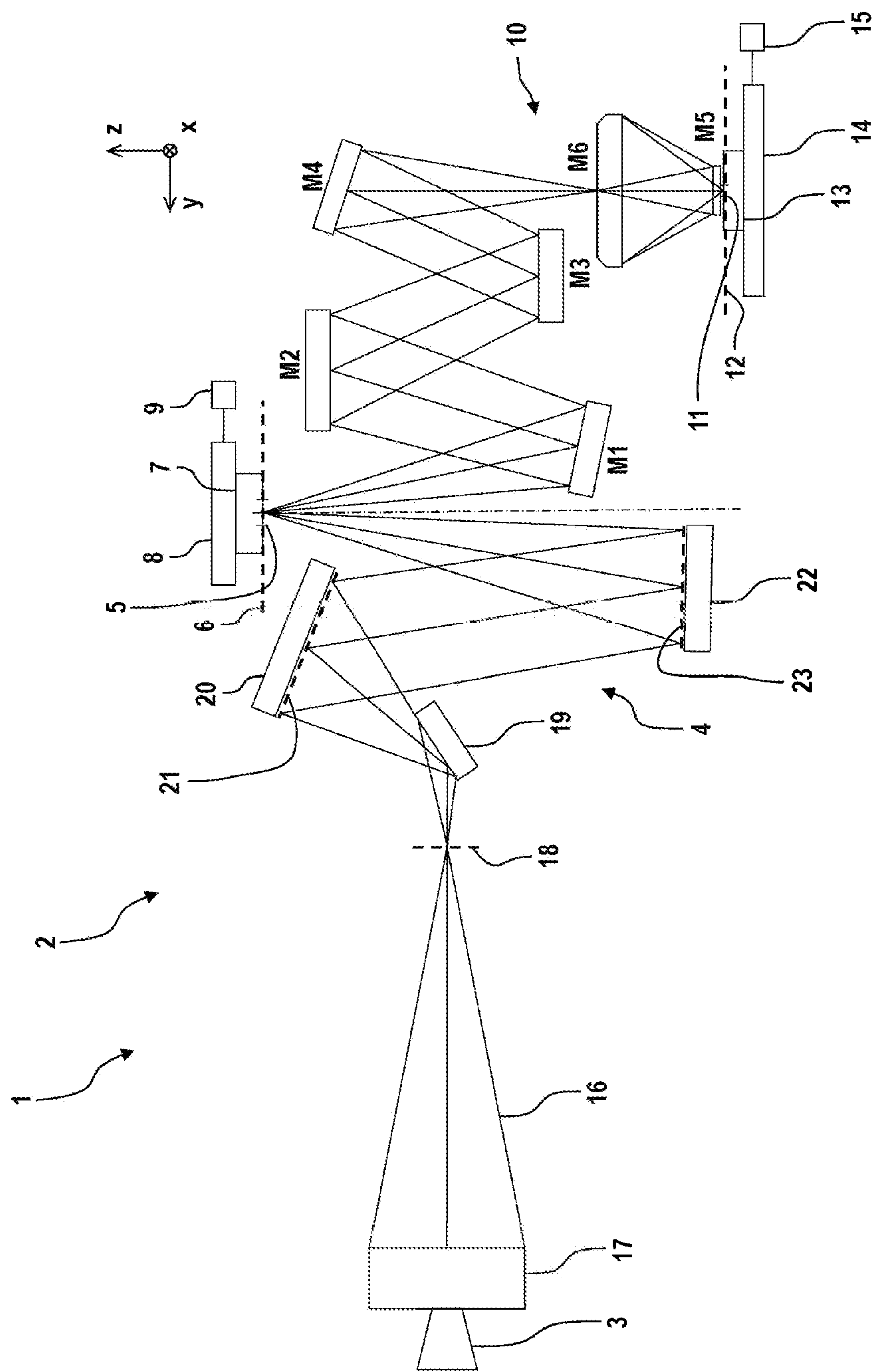
FIG. 1 shows a schematic meridional section of a projection exposure apparatus for EUV projection lithography.

FIG. 1 shows an embodiment of a projection exposure apparatus 1 (lithography apparatus). One embodiment of an illumination system 2 of the projection exposure apparatus 1 has, in addition to a light or radiation source 3, an illumination optical unit 4 for illuminating an object field 5 in an object plane 6. In an alternative embodiment, the light source 3 may also be provided as a module separate from the rest of the illumination system 2. In this case, the illumination system 2 does not comprise the light source 3.

A reticle 7 arranged in the object field 5 is exposed. The reticle 7 is held by a reticle holder 8. The reticle holder 8 is displaceable by way of a reticle displacement drive 9, for example in a scanning direction.

FIG. 1 shows, for explanatory purposes, a Cartesian coordinate system with an x-direction x, a y-direction y and a z-direction z. The x-direction x runs perpendicularly into the plane of the drawing. The y-direction y runs horizontally, and the z-direction z runs vertically. The scanning direction in FIG. 1 runs in the y-direction y. The z-direction z runs perpendicularly to the object plane 6.

The projection exposure apparatus 1 comprises a projection optical unit 10. The projection optical unit 10 serves for imaging the object field 5 into an image field 11 in an image plane 12. The image plane 12 runs parallel to the object plane 6. Alternatively, an angle that differs from 0° between the object plane 6 and the image plane 12 is also possible.

A structure on the reticle 7 is imaged onto a light-sensitive layer of a wafer 13 arranged in the region of the image field 11 in the image plane 12. The wafer 13 is held by a wafer holder 14. The wafer holder 14 is displaceable by way of a wafer displacement drive 15, for example in the y-direction y. The displacement, firstly, of the reticle 7 by way of the reticle displacement drive 9 and, secondly, of the wafer 13 by way of the wafer displacement drive 15 can be implemented so as to be mutually synchronized.

The light source 3 is an EUV radiation source. The light source 3 emits for example EUV radiation 16, which is also referred to below as used radiation, illumination radiation or illumination light. For example, the used radiation 16 has a wavelength in the range between 5 nm and 30 nm. The light source 3 may be a plasma source, for example an LPP (short for: laser produced plasma) source or a DPP (short for: gas-discharge produced plasma) source. It may also be a synchrotron-based radiation source. The light source 3 may be an FEL (short for: free-electron laser).

The illumination radiation 16 emerging from the light source 3 is focused by a collector 17. The collector 17 can be a collector with one or more ellipsoidal and/or hyperboloidal reflection surfaces. The at least one reflection surface of the collector 17 may be impinged upon by the illumination radiation 16 with grazing incidence (GI), that is to say at angles of incidence of greater than 45° , or with normal incidence (NI), that is to say at angles of incidence of less than 45°. The collector 17 can be structured and/or coated firstly for optimizing its reflectivity for the used radiation and secondly for suppressing extraneous light.

Downstream of the collector 17, the illumination radiation 16 propagates through an intermediate focus in an intermediate focal plane 18. The intermediate focal plane 18 may represent a separation between a radiation source module, having the light source 3 and the collector 17, and the illumination optical unit 4.

The illumination optical unit 4 comprises a deflection minor 19 and, arranged downstream thereof in the beam path, a first facet mirror 20. The deflection mirror 19 may be a plane deflection mirror or, alternatively, a minor with a beam-influencing effect going beyond a pure deflection effect. As an alternative or in addition, the deflection mirror 19 may be in the form of a spectral filter that separates a used light wavelength of the illumination radiation 16 from extraneous light of a wavelength deviating therefrom. If the first facet mirror 20 is arranged in a plane of the illumination optical unit 4 that is optically conjugate to the object plane 6 as a field plane, it is also referred to as a field facet mirror. The first facet minor 20 comprises a multiplicity of individual first facets 21, which may also be referred to as field facets. Only some of these first facets 21 are shown in FIG. 1 by way of example.

The first facets 21 may be embodied as macroscopic facets, for example as rectangular facets or as facets with an arcuate edge contour or an edge contour of part of a circle. The first facets 21 may be in the form of plane facets or alternatively as facets with convex or concave curvature.

As is known for example from DE 10 2008 009 600 A1, the first facets 21 themselves can also each be composed of a multiplicity of individual mirrors, for example a multiplicity of micromirrors. The first facet minor 20 may for example be in the form of a microelectromechanical system (MEMS system). For details, reference is made to DE 10 2008 009 600 A1.

Between the collector 17 and the deflection minor 19, the illumination radiation 16 travels horizontally, which is to say in the y-direction y.

In the beam path of the illumination optical unit 4, a second facet mirror 22 is arranged downstream of the first facet mirror 20. If the second facet mirror 22 is arranged in a pupil plane of the illumination optical unit 4, it is also referred to as a pupil facet mirror. The second facet mirror 22 can also be arranged at a distance from a pupil plane of the illumination optical unit 4. In this case, the combination of the first facet mirror 20 and the second facet mirror 22 is also referred to as a specular reflector. Specular reflectors are known from US 2006/0132747 A1, EP 1 614 008 B1, and U.S. Pat. No. 6,573,978.

The second facet mirror 22 comprises a plurality of second facets 23. In the case of a pupil facet mirror, the second facets 23 are also referred to as pupil facets.

The second facets 23 may likewise be macroscopic facets, which may for example have a round, rectangular, or else hexagonal periphery, or may alternatively be facets composed of micromirrors. In this regard, reference is also made to DE 10 2008 009 600 A1.

The second facets 23 may have plane reflection surfaces or alternatively reflection surfaces with a convex or concave curvature.

The illumination optical unit 4 consequently forms a double-faceted system. This fundamental principle is also referred to as a fly's eye integrator .

It may be advantageous to arrange the second facet mirror 22 not exactly in a plane that is optically conjugate to a pupil plane of the projection optical unit 10. For example, the second facet mirror 22 can be arranged so as to be tilted in relation to a pupil plane of the projection optical unit 10, as is described for example in DE 10 2017 220 586 A1.

The individual first facets 21 are imaged into the object field 5 using the second facet mirror 22. The second facet mirror 22 is the last beam-shaping mirror or indeed the last mirror for the illumination radiation 16 in the beam path upstream of the object field 5.

In a further embodiment (not illustrated) of the illumination optical unit 4, a transfer optical unit can be arranged in the beam path between the second facet mirror 22 and the object field 5, the transfer optical unit contributing for example to the imaging of the first facets 21 into the object field 5. The transfer optical unit can comprise exactly one mirror, but alternatively also two or more mirrors, which are arranged in succession in the beam path of the illumination optical unit 4. The transfer optical unit can for example comprise one or two normal-incidence mirrors (NI mirrors) and/or one or two grazing-incidence mirrors (GI mirrors).

In the embodiment shown in FIG. 1, the illumination optical unit 4 has exactly three mirrors downstream of the collector 17, specifically the deflection mirror 19, the first facet mirror 20, and the second facet mirror 22.

In a further embodiment of the illumination optical unit 4, there is also no need for the deflection mirror 19, and so the illumination optical unit 4 may then have exactly two mirrors downstream of the collector 17, specifically the first facet mirror 20 and the second facet mirror 22.

The imaging of the first facets 21 into the object plane 6 via the second facets 23 or using the second facets 23 and a transfer optical unit is often only approximate imaging.

The projection optical unit 10 comprises a plurality of mirrors Mi, which are consecutively numbered in accordance with their arrangement in the beam path of the projection exposure apparatus 1.

In the example shown in FIG. 1, the projection optical unit 10 comprises six mirrors M1 to M6. Alternatives with four, eight, ten, twelve or any other number of mirrors Mi are similarly possible. The projection optical unit 10 is a twice-obscured optical unit. The penultimate minor M5 and the last mirror M6 each have a passage opening for the illumination radiation 16. The projection optical unit 10 has an image-side numerical aperture that is greater than 0.5 and may also be greater than 0.6 and may be for example or 0.75.

Reflection surfaces of the mirrors Mi can be embodied as freeform surfaces without an axis of rotational symmetry. Alternatively, the reflection surfaces of the mirrors Mi can be designed as aspherical surfaces with exactly one axis of rotational symmetry of the reflection surface shape. Just like the minors of the illumination optical unit 4, the mirrors Mi may have highly reflective coatings for the illumination radiation 16. These coatings can be designed as multilayer coatings, for example with alternating layers of molybdenum and silicon.

The projection optical unit 10 has a large object-image offset in the y-direction y between a y-coordinate of a centre of the object field 5 and a y-coordinate of the centre of the image field 11. This object-image offset in the y-direction y may be of approximately the same magnitude as a z-distance between the object plane 6 and the image plane 12.

The projection optical unit 10 may for example have an anamorphic form. It has for example different imaging scales $\beta x$, $\beta y$ in the x- and y-directions x, y. The two imaging scales $\beta x$, $\beta y$ of the projection optical unit 10 can be ($\beta x$, ($\beta y$)=(+/−0.25, +/−0.125). A positive imaging scale $\beta$ means imaging without image inversion. A negative sign for the imaging scale $\beta$ means imaging with image inversion.

The projection optical unit 10 consequently leads to a reduction in size with a ratio of 4:1 in the x-direction x, which is to say in a direction perpendicular to the scanning direction.

The projection optical unit 10 leads to a reduction in size of 8:1 in the y-direction y, which is to say in the scanning direction.

Other imaging scales are likewise possible. Imaging scales with the same sign and the same absolute value in the x-direction x and y-direction y are also possible, for example with absolute values of 0.125 or of 0.25.

The number of intermediate image planes in the x-direction x and in the y-direction y in the beam path between the object field 5 and the image field 11 may be the same or may differ, depending on the embodiment of the projection optical unit 10. Examples of projection optical units with different numbers of such intermediate images in the x- and y-directions x, y are known from US 2018/0074303 A1.

In each case one of the second facets 23 is assigned to exactly one of the first facets 21 for respectively forming an illumination channel for illuminating the object field 5. This may for example produce illumination according to the Köhler principle. The far field is decomposed into a multiplicity of object fields 5 with the aid of the first facets 21. The first facets 21 produce a plurality of images of the intermediate focus on the second facets 23 respectively assigned to them.

By way of an assigned second facet 23, the first facets 21 are in each case imaged onto the reticle 7 in a manner overlaid on one another for the purposes of illuminating the object field 5. The illumination of the object field 5 is for example as homogeneous as possible. It can have a uniformity error of less than 2%. The field uniformity can be achieved by overlaying different illumination channels.

The illumination of the entrance pupil of the projection optical unit 10 may be defined geometrically by an arrangement of the second facets 23. The intensity distribution in the entrance pupil of the projection optical unit 10 may be set by selecting the illumination channels, for example the subset of the second facets 23, which guide light. This intensity distribution is also referred to as illumination setting or illumination pupil filling.

A likewise desirable pupil uniformity in the region of sections of an illumination pupil of the illumination optical unit 4 which are illuminated in a defined manner may be achieved by a redistribution of the illumination channels.

Further aspects and details of the illumination of the object field 5 and for example of the entrance pupil of the projection optical unit 10 are described hereinbelow.

The projection optical unit 10 may for example have a homocentric entrance pupil. The latter can be accessible. It can also be inaccessible.

The entrance pupil of the projection optical unit 10 frequently cannot be exactly illuminated with the second facet minor 22. When imaging the projection optical unit 10, which images the centre of the second facet mirror 22 telecentrically onto the wafer 13, the aperture rays often do not intersect at a single point. However, it is possible to find a surface area in which the spacing of the aperture rays, determined in pairwise fashion, is minimal. This surface area represents the entrance pupil or an area in real space that is conjugate thereto. For example, this surface area has a finite curvature.

It may be the case that the projection optical unit 10 has different poses of the entrance pupil for the tangential beam path and for the sagittal beam path. In this case, an imaging element, for example an optical component of the transfer optical unit, should be provided between the second facet minor 22 and the reticle 7. With the aid of this optical element, the different poses of the tangential entrance pupil and the sagittal entrance pupil can be taken into account.

In the arrangement of the component parts of the illumination optical unit 4 shown in FIG. 1, the second facet minor 22 is arranged in an area conjugate to the entrance pupil of the projection optical unit 10. The first facet mirror 20 is arranged so as to be tilted in relation to the object plane 6.

The first facet minor 20 is arranged so as to be tilted with respect to an arrangement plane defined by the deflection mirror 19. The first facet minor 20 is arranged tilted with respect to an arrangement plane defined by the second facet mirror 22.

Figure 2:
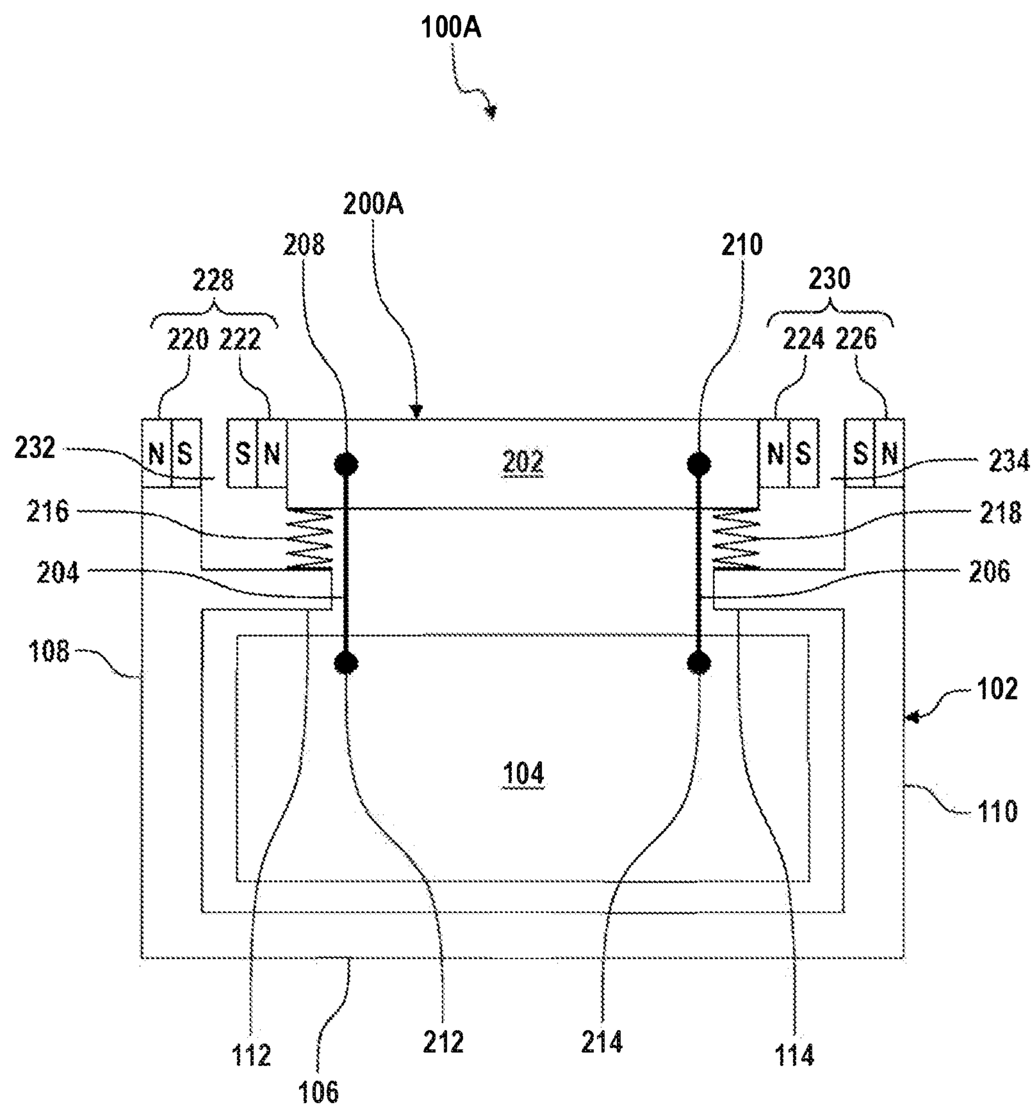
FIG. 2 shows a schematic view of an embodiment of a system for the projection exposure apparatus according to FIG. 1.
Figure 2:
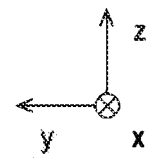
Figure 3:
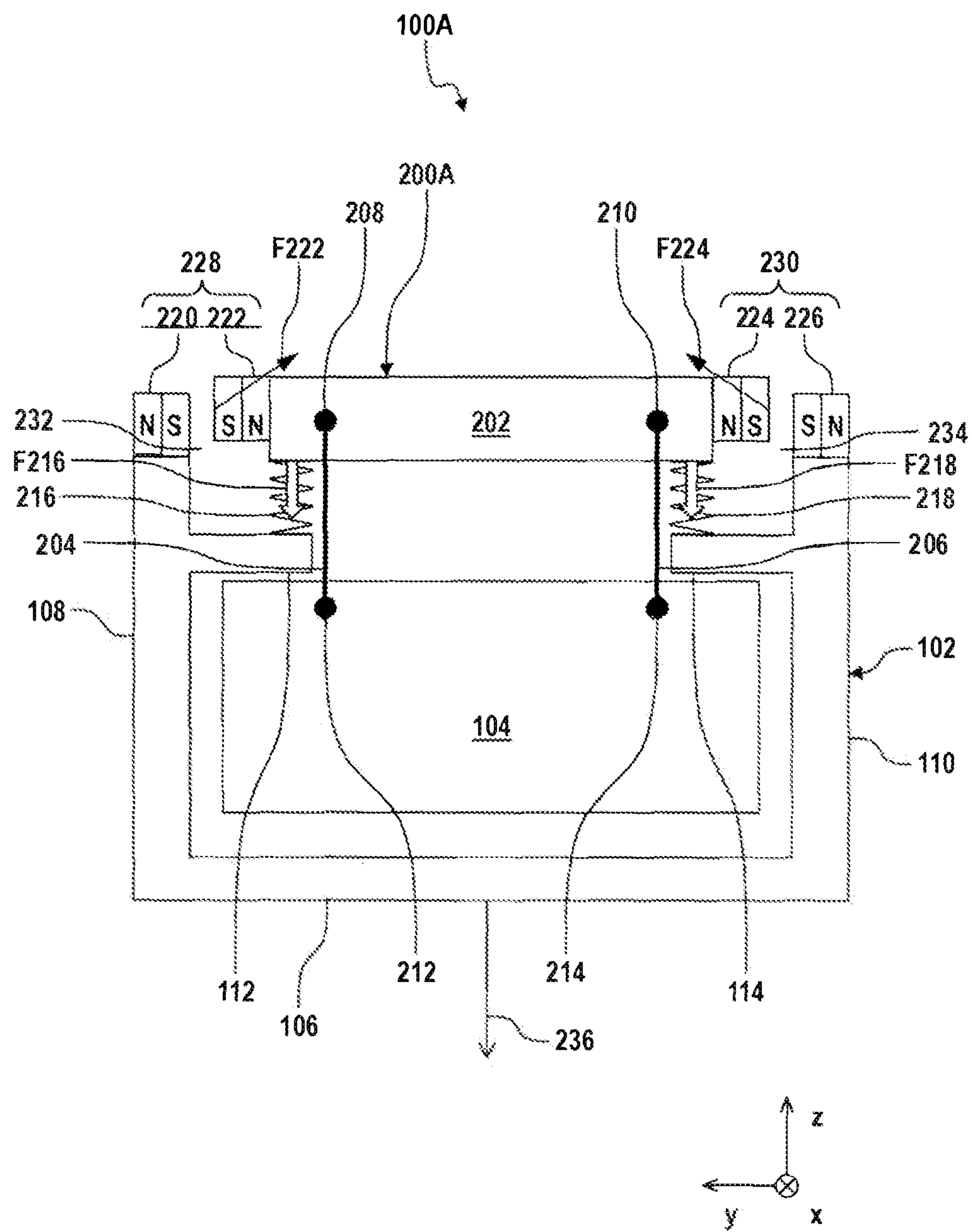
FIG. 3 shows a further schematic view of the system according to FIG. 2.

FIG. 2 and FIG. 3 each show a schematic view of an embodiment of a system 100A for the projection exposure apparatus 1. For example, the system 100A can be a projection optical unit 10, as explained above, or part of the projection optical unit 10. A coordinate system, as previously mentioned, having a first spatial direction or x-direction x, a second spatial direction or y-direction y and a third spatial direction or z-direction z is assigned to the system 100A.

The system 100A comprises a first component 102 and a second component 104. The components 102, 104 can be any component parts of the projection optical unit 10. It is assumed hereinafter that the first component 102 is a force frame. The first component 102 is therefore referred to hereinafter as a force frame. The second component 104 is a sensor frame and is hereinafter referred to as such. The sensor frame 104 can support a sensor system (not shown).

The force frame 102 has a substantially U-shaped structure that extends along the x-direction x. The force frame 102 may, however, have any desired geometry. The force frame 102 comprises a base section 106 and two wall sections 108, 110, which are provided on the sides of the base section 106. Protruding from each of the wall sections 108, 110 are arm sections 112, 114, which extend in the direction of the respectively opposite wall section 108, 110.

The sensor frame 104 is shown in a highly simplified form as a block-shaped or cuboid component. The sensor frame 104 may, however, have any desired geometry. The sensor frame 104 is arranged within the force frame 102. That is to say that the force frame 102 surrounds the sensor frame 104 at least in sections.

The system 100A comprises a decoupling device 200A, which is suitable for preventing a mechanical excitation of the force frame 102 from the outside from being transmitted to the sensor frame 104. The decoupling device 200A thus decouples the sensor frame 104 from the force frame 102. The decoupling device 200A comprises an intermediate component 202, which is connected into a force path between the force frame 102 and the sensor frame 104. The intermediate component 202 is block-shaped or cuboid. The intermediate component 202 may, however, have any desired geometry. In the present case, the intermediate component 202 is an intermediate frame and is also referred to hereinafter in this way.

The intermediate frame 202 is coupled to the sensor frame 104 via flexible third decoupling elements 204, 206. The third decoupling elements 204, 206 may be referred to as cables or tension cables. "Flexible" in this context means that the third decoupling elements 204, 206 can only transmit tensile forces oriented counter to the z-direction z, for example as a result of a weight force of the sensor frame 104. No forces can be transmitted in the other directions x, y. For example, it is possible to provide four third decoupling elements 204, 206, which are arranged spaced apart from one another along the y-direction y and along the x-direction x. However, it is also possible for only three third decoupling elements 204, 206 to be provided.

The third decoupling elements 204, 206 are connected at connection points 208, 210 to the intermediate frame 202. The connection points 208, 210 are placed spaced apart from one another along the y-direction y. Furthermore, the third decoupling elements 204, 206 are connected to the sensor frame 104 via connection points 211, 214. Further connection points (not shown) are provided, which are spaced apart from the connection points 208, 210, as viewed along the x-direction x. The third decoupling elements 204, 206 can be cables, for example steel cables or plastic cables, which are hooked into the intermediate frame 202 and the sensor frame 104.

The decoupling device 200A further comprises first decoupling elements 216, 218, which are arranged between the intermediate frame 202 and the force frame 102. The first decoupling elements 216, 218 are spring elements and may also be referred to as such. Four first decoupling elements 216, 218 can be provided, wherein in the event of the intermediate frame 202 being square, a first decoupling element 216, 218 is mounted at each corner of the intermediate frame 202. The first decoupling elements 216, 218 are placed between the arm sections 112, 114 of the force frame 102 and the intermediate frame 202. The arm sections 112, 114 thus carry the first decoupling elements 216, 218.

The first decoupling elements 216, 218 are loaded with a weight force of the intermediate frame 202 and the previously mentioned weight force of the sensor frame 104, which is transmitted via the third decoupling elements 204, 206 to the intermediate frame 202.

The first decoupling elements 216, 218 are helical springs. However, the first decoupling elements 216, 218 may also be disk springs or disk spring packages. The first decoupling elements 216, 218, on the one hand, can be pulled apart along the z-direction z and, on the other hand, can be compressed counter to the z-direction z. The first decoupling elements 216, 218 may be compression springs. However, the term "compression springs" does not preclude that the first decoupling elements 216, 218 can also be pulled apart.

The decoupling device 200A has second decoupling elements 220, 222, 224, 226. The second decoupling elements 220, 222, 224, 226 are magnetic elements and may also be referred to as such. The second decoupling elements 220, 222, 224, 226 are permanent magnets. The second decoupling elements 220, 222, 224, 226 are placed in the form of pairs of magnetic elements 228, 230 on both sides of the intermediate frame 202. The intermediate frame 202 is placed between the second decoupling elements 222, 224, as viewed along the y-direction y. The second decoupling elements 220, 222 here form a first pair of magnetic elements 228. The second decoupling elements 224, 226 form a second pair of magnetic elements 230.

The second decoupling elements 220, 226 are firmly connected to the force frame 102. The second decoupling elements 222, 224 are firmly connected to the intermediate frame 202. An air gap 232, 234 is in each case provided here between the second decoupling elements 220, 222 and the second decoupling elements 224, 226. Every second decoupling element 220, 222, 224, 226 has a north pole N and a south pole S. The second decoupling elements 220, 222, 224, 226 are placed in such a way that the north pole N and the south pole S are arranged side by side, as viewed along the y-direction y. The second decoupling elements 220, 222, 224, 226 of each pair of magnetic elements 228, 230 are arranged here in such a way that the south poles S are arranged facing each other. The second decoupling elements 220, 222, 224, 226 of each pair of magnetic elements 228, 230 thus repel each other.

The functionality of the decoupling device 200A is explained hereinafter. FIG. 2 shows the system 100A in a position of equilibrium in which the force frame 102 is not deflected. In the position of equilibrium, the south poles S of the second decoupling elements 220, 222, 224, 226 are placed opposite each other. FIG. 3 shows the system 100A in a deflected state. In the deflected state, the force frame 102 is deflected, for example by vibrations, as indicated in FIG. 3 via an arrow 236. The force frame 102 moves downwards counter to the z-direction z because of its deflection in the orientation of FIG. 3.

Owing to its mass inertia, the intermediate frame 202 initially remains in its starting position, as a result of which the force frame 102 moves away from the intermediate frame 202 and the first decoupling elements 216, 218 are elongated. The elongation of the first decoupling elements 216, 218 causes each first decoupling element 216, 218 to apply a force F216, F218 to the intermediate frame 202. The forces F216, F218 are oriented counter to the z-direction z. The forces F216, F218 thus act counter to the deflection of the first decoupling elements 216, 218.

When the force frame 102 is deflected, the second decoupling elements 220, 226 assigned to the force frame 102 are deflected in relation to the second decoupling elements 222, 224, which are assigned to the intermediate frame 202. Forces F222, F224 are generated which act on the intermediate frame 202 and are oriented obliquely with 20 respect to the forces F216, F218.

Figure 4:
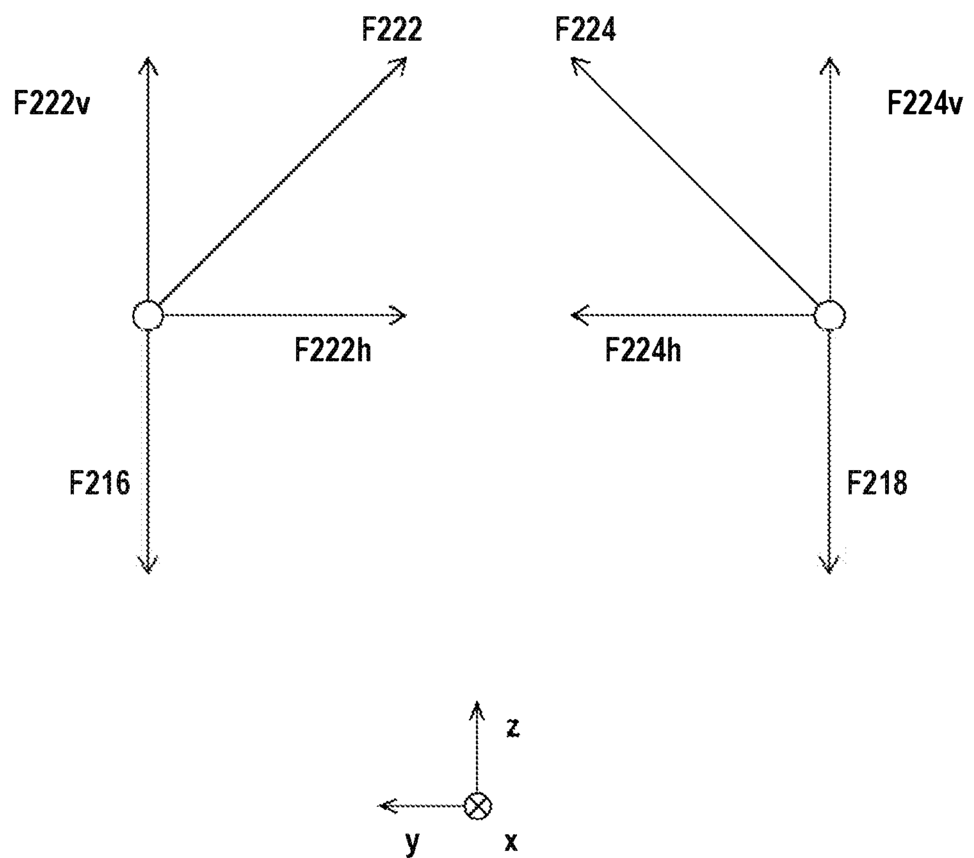
FIG. 4 shows schematically forces acting on an intermediate component of the system according to FIG. 1.

FIG. 4 shows in very highly schematized form the forces F216, F218, F222, F224 acting on the intermediate frame 202. As previously mentioned, the forces F216, F218 act counter to the z-direction z. The obliquely acting forces F222, F224 can each be broken 25 down into a horizontal force component F222*h*, F224*h* and into a vertical force component F222*v*, F224*v*. The horizontal force components F222*h*, F224*h* act counter to and in the y-direction y. The horizontal force components F222*h*, F224*h* are the same size and act in opposite directions, and therefore the horizontal force components F222*h*, F224*h* cancel each other out. In the horizontal direction or along and counter to the y-direction y, the intermediate frame 202 is therefore free of force.

The vertical force components F222*v*, F224*v* act along the z-direction z and thus counter to the forces F216, F218. The vertical force components F222*v*, F224*v* and the forces F216, F218 are equal. The vertical force components F222*v*, F224*v* and the forces F216, F218 thus cancel each other out. The intermediate frame 202 is accordingly always free of force. This freedom from force results in a very low natural frequency.

The first decoupling elements 216, 218 have a positive stiffness, as viewed in the z-direction z. That is to say that the forces F216, F218 are oriented counter to a deflection direction of the first decoupling elements 216, 218 or counter to a deflection direction of the intermediate frame 202 relative to the force frame 102, or vice versa. In contrast thereto, the pairs of magnetic elements 228, 230 have a negative stiffness in the z-direction z.

That is to say that the forces F222, F224, for example the vertical force components F222*v*, F224*v*, are oriented in a deflection direction of the intermediate frame 202 relative to the force frame 102. This results in zero stiffness of the decoupling device 200A in the z-direction z. In the horizontal direction or in the y-direction y, a very low decoupling frequency can be achieved via a parallel arrangement of the third decoupling elements 204, 206 in the form of cables.

Figure 5:
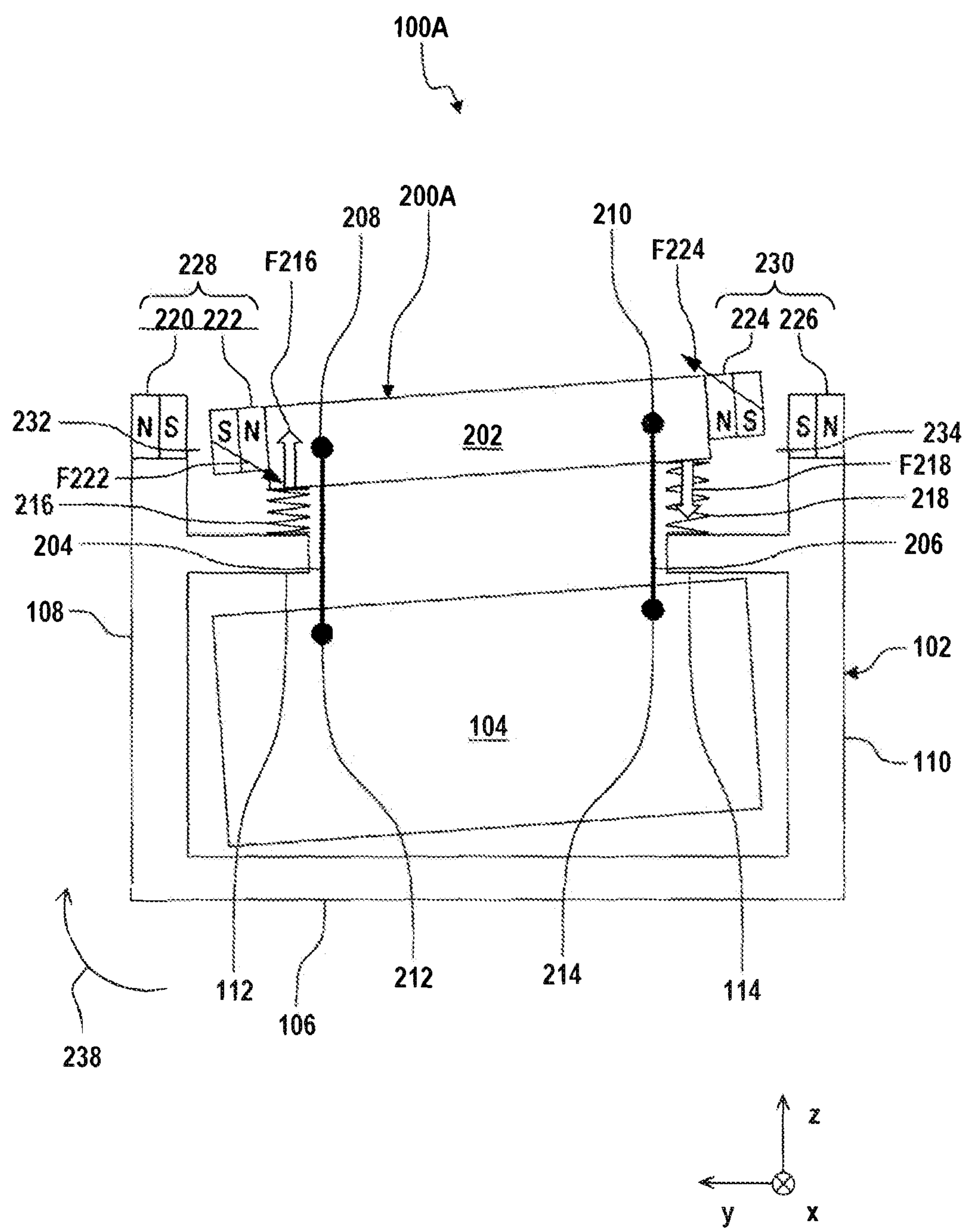
FIG. 5 shows a further schematic view of the system according to FIG. 1.

FIG. 5 shows a further view of the system 100A, wherein the force frame 102 in this case is excited by rotating or tilting relative to the sensor frame 104, as indicated via an arrow 236. When the force frame 102 is rotated, the first decoupling element 216 is compressed and the first decoupling element 218 is elongated. By this approach, the first decoupling element 216 applies a force F216 acting in the z-direction z to the intermediate frame 202. The first decoupling element 218 applies a force F218 acting counter to the z-direction z to the intermediate frame 202. The forces F216, F218 are oriented in opposite directions to each other.

The second decoupling element 222 applies a force F222, which is obliquely oriented to the bottom right in the orientation of FIG. 5, to the intermediate frame 202. Correspondingly, the second decoupling element 224 applies a force F224, which is obliquely oriented to the top left in the orientation of FIG. 5, to the intermediate frame 202.

Figure 6:
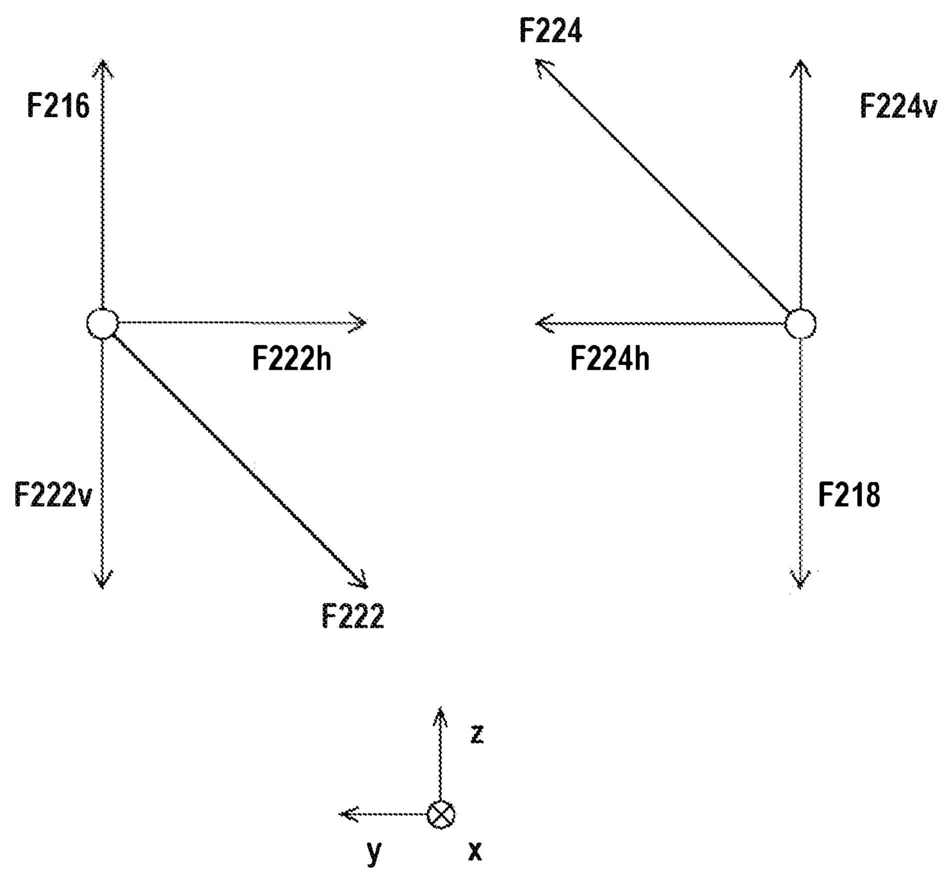
FIG. 6 shows schematically forces acting on an intermediate component of the system according to FIG. 5.

FIG. 6 shows in very highly schematized form the forces F216, F218, F222, F224 acting on the intermediate frame 202. As previously mentioned, the force F216 acts in the z-direction z. The force F218 acts counter to the z-direction z and thus also counter to the force F216. The obliquely acting forces F222, F224 can be broken down into a horizontal force component F222*h*, F224*h* and into a vertical force component F222*v*, F224*v* in each case. The horizontal force components F222*h*, F224*h* act counter to and in the y-direction y. The horizontal force components F222*h*, F224*h* are the same size and act in opposite directions, and therefore the horizontal force components F222*h*, F224H cancel each other out. In the horizontal direction or along and counter to the y-direction y, the intermediate frame 202 is therefore free of force.

The vertical force component F222*v* acts counter to the z-direction z. The vertical force component F224*v* acts along the z-direction z. The vertical force component F222*v* and the force F216 cancel each other out. Accordingly, the vertical force component F224*v* and the force F218 also cancel each other out. The intermediate frame 202 is therefore free from force. This gives rise to zero stiffness of the decoupling device 200A even when the force frame 102 is rotated.

Figure 7:
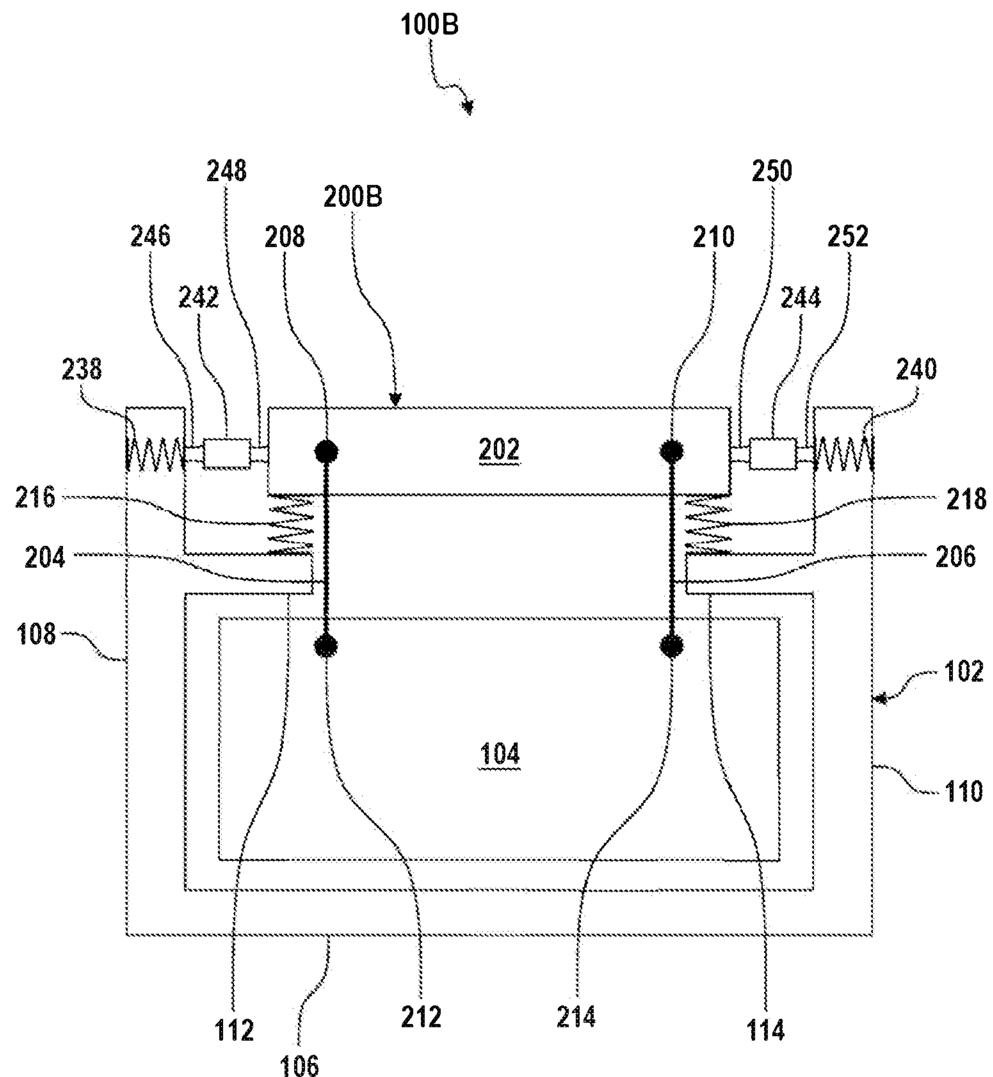
FIG. 7 shows a schematic view of a further embodiment of a system for the projection exposure apparatus according to FIG. 1.
Figure 8:
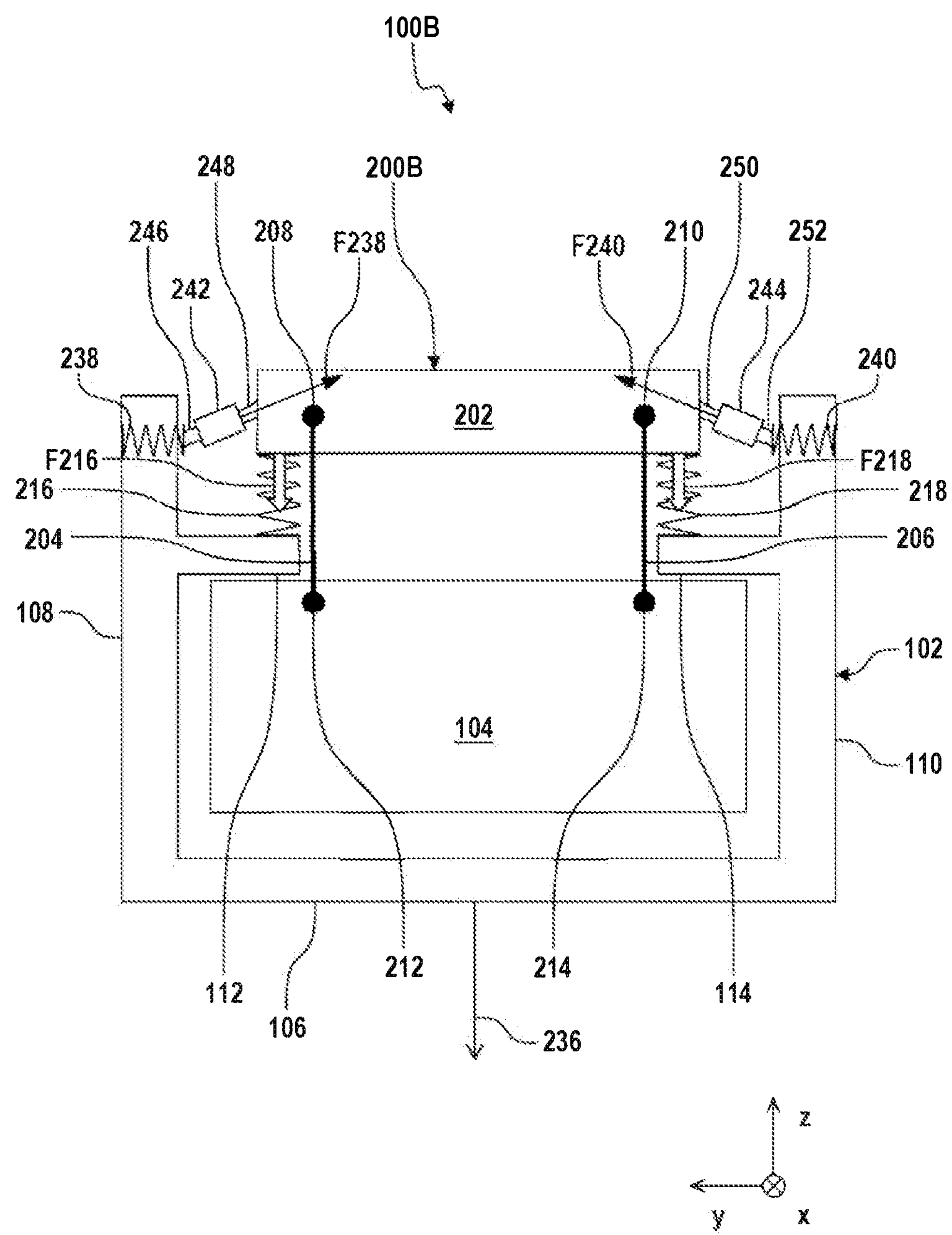
FIG. 8 shows a further schematic view of the system according to FIG. 7.

FIG. 7 and FIG. 8 each show a schematic view of a further embodiment of a system 100B for the projection exposure apparatus 1. The system 100B substantially corresponds in design to that of the optical system 100A. Only differences between the systems 100A, 100B will therefore be discussed hereinafter. The system 100B differs from the system 100A only in that the system 100B has a further embodiment of a decoupling device 200B.

The decoupling device 200B comprises an intermediate frame 202, as previously explained, which is supported on a force frame 102, as previously explained, via the first decoupling elements 216, 218. Furthermore, the decoupling device 200B has second decoupling elements 238, 240 in the form of spring elements which are oriented perpendicular to the first decoupling elements 216, 218. The second decoupling elements 238, 240 are helical springs. However, the second decoupling elements 238, 240 may also be disk springs or disk spring packages. The second decoupling elements 238, 240 are pretensioned compression springs. The second decoupling elements 238, 240 may also be referred to as spring elements.

Provided between the second decoupling elements 238, 240 and the intermediate frame 202 are compression rods 242, 244, which can each apply a compressive force from the second decoupling elements 238, 240 to the intermediate frame 202. The compression rod 242 is connected to the second decoupling element 238 via a flexure 246 and to the intermediate frame 202 via a flexure 248. Accordingly, the compression rod 244 is connected to the intermediate frame 202 via a flexure 250 and to the second decoupling element 240 via a flexure 252. In the present case, a “flexure” should be understood to mean a region of a component which, by bending, allows a relative movement between two rigid body regions.

The functionality of the decoupling device 200B is explained hereinafter. FIG. 7 shows the system 100B in a position of equilibrium in which the force frame 102 is not deflected. In the position of equilibrium, the compression rods 242, 244 are arranged horizontally and thus run along the y-direction y. The second decoupling elements 238, 240 apply compressive forces to the intermediate frame 202 via the compression rods 242, 244, which compressive forces are the same size and are oriented in opposite directions, and therefore they cancel each other out.

FIG. 8 shows the system 100B in a deflected state. In the deflected state, the force frame 102 is deflected, for example by vibrations, as indicated in FIG. 8 via an arrow 236. The force frame 102 moves downwards counter to the z-direction z because of its deflection in the orientation of FIG. 8.

Owing to its mass inertia, the intermediate frame 202 initially remains in its starting position, as a result of which the force frame 102 moves away from the intermediate frame 202 and the first decoupling elements 216, 218 are elongated. The elongation of the first decoupling elements 216, 218 causes each first decoupling element 216, 218 to apply a force F216, F218 to the intermediate frame 202. The forces F216, F218 are oriented counter to the z-direction z. The forces F216, F218 thus act counter to the deflection of the first decoupling elements 216, 218.

When the force frame 102 is deflected, the compression rods 242, 244 are deflected. Forces F238, F240 are generated which act on the intermediate frame 202 and are oriented obliquely with respect to the forces F216, F218.

Figure 9:
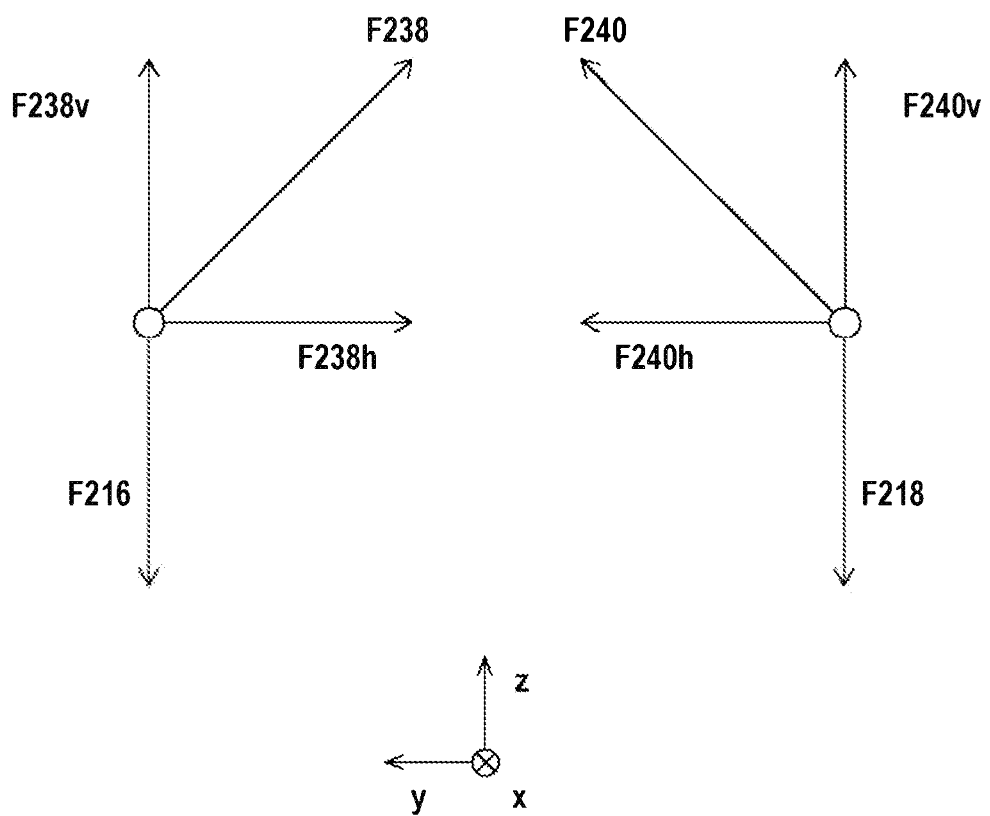
FIG. 9 shows schematically forces acting on an intermediate component of the system according to FIG. 7.

FIG. 9 shows in very highly schematized form the forces F216, F218, F238, F240 acting on the intermediate frame 202. As previously mentioned, the forces F216, F218 act counter to the z-direction z. The obliquely acting forces F238, F240 can each be broken down into a horizontal force component F238*h*, F240*h* and into a vertical force component F238*v*, F240*v*. The horizontal force components F238*h*, F240*h* act counter to and in the y-direction y. The horizontal force components F238*h*, F240*h* are the same size and act in opposite directions, and therefore the horizontal force components F238*h*, F240*h* cancel each other out. In the horizontal direction or along and counter to the y-direction y, the intermediate frame 202 is therefore free of force.

The vertical force components F238*v*, F250*v* act along the z-direction z and thus counter to the forces F216, F218. The vertical force components F238*v*, F240*v* and the forces F216, F218 are equal. The vertical force components F238*v*, F240*v* and the forces F216, F218 thus cancel each other out. The intermediate frame 202 is accordingly always free of force. This freedom from force results in a very low natural frequency.

The first decoupling elements 216, 218 have a positive stiffness, as viewed in the z-direction z. That is to say that the forces F216, F218 are oriented counter to a deflection direction of the first decoupling elements 216, 218 or counter to a deflection direction of the intermediate frame 202 relative to the force frame 102. The pretensioned second decoupling elements 238, 240, on the other hand, have a negative stiffness. That is to say that the forces F238, F240, for example the vertical force components F238*v*, F240*v*, are oriented in a deflection direction of the intermediate frame 202 relative to the force frame 102. This results in zero stiffness of the decoupling device 200A in the z-direction z. The same applies to a rotation of the force frame 102, as shown in FIGS. 5 and 6.

Figure 10:
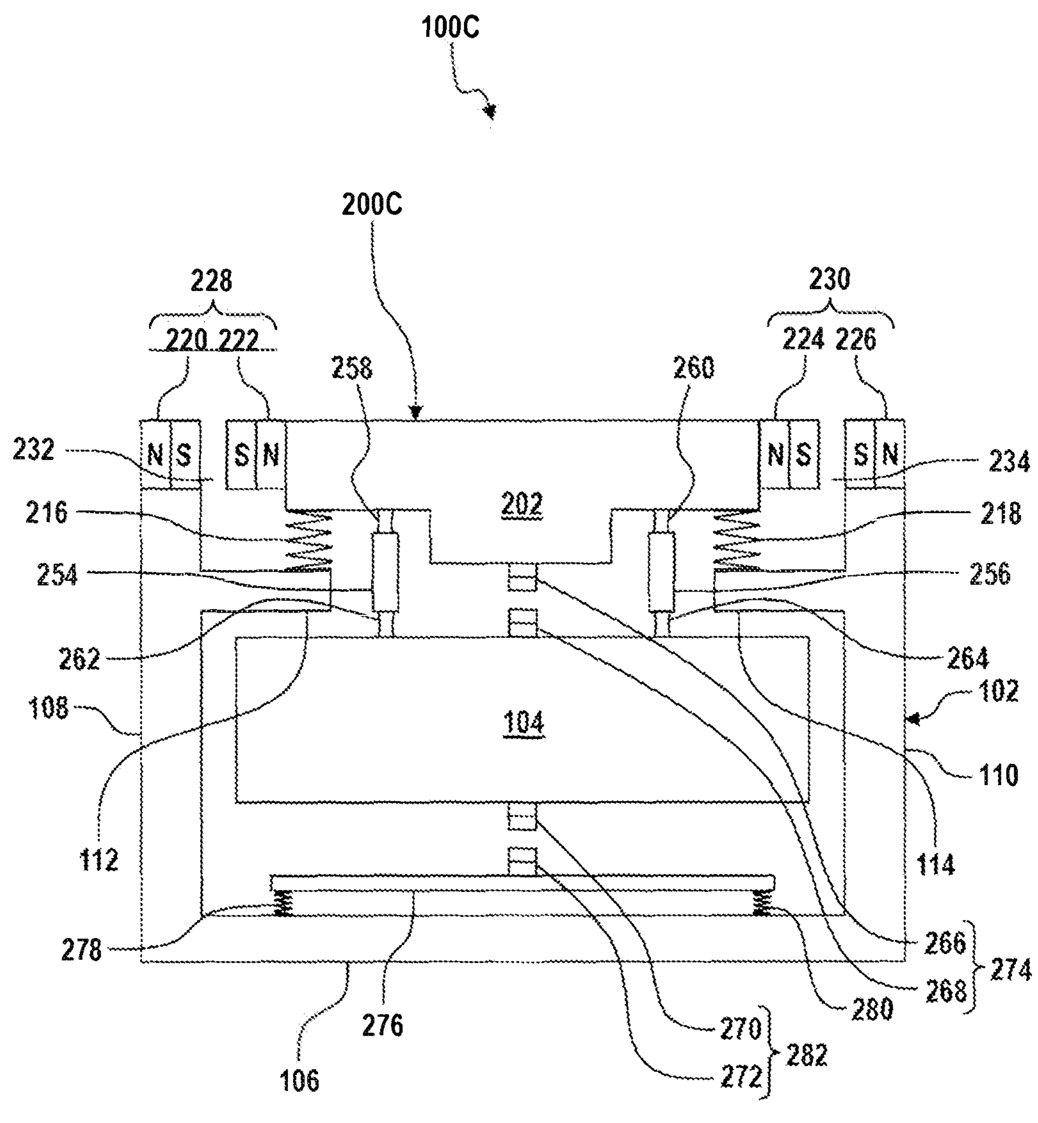
FIG. 10 shows a schematic view of a further embodiment of a system for the projection exposure apparatus according to FIG. 1.

FIG. 10 shows a schematic view of a further embodiment of a system 100C for the projection exposure apparatus 1. The system 100C substantially corresponds in design to that of the optical system 100A. Only differences between the systems 100A, 100C will therefore be discussed hereinafter.

The system 100C comprises a decoupling device 200C, which substantially corresponds in design to that of the decoupling device 200A. In contrast to the system 100A, the system 100C does not comprise third decoupling elements 204, 206 in the form of cables, with which the sensor frame 104 is suspended on the intermediate frame 202. On the contrary, third decoupling elements 254, 256 are provided in the form of tension rods which are coupled to the intermediate frame 202 via flexures 258, 260 and to the sensor frame 104 via flexures 262, 264. For example, four third decoupling elements 254, 256 may be provided. The third decoupling elements 254, 256 may also be referred to as tension rods.

Since small horizontal forces can be transmitted via the flexures 258, 260, 262, 264, mounting of the sensor frame 104 is additionally provided via fourth decoupling elements 266, 268, 270, 272. The fourth decoupling elements 266, 268, 270, 272 are magnetic elements and may also be referred to as such. The fourth decoupling element 266 is attached here to the intermediate frame 202. The fourth decoupling element 268 is attached to the sensor frame 104. The fourth decoupling elements 266, 268 form a pair of magnetic elements 274. The fourth decoupling elements 266, 268 are placed here in such a way that their south poles S or north poles N are arranged opposite each other.

The fourth decoupling element 270 is attached to the intermediate frame 202. The fourth decoupling element 272 is mounted on a plate-like component 276, which is placed between the force frame 102 and the intermediate frame 104. The component 276 is decoupled from the force frame 102 by very soft fifth decoupling elements 278, 280. The fourth decoupling elements 270, 272 form a pair of magnetic elements 282. The fourth decoupling elements 270, 272 are placed here in such a way that their south poles S or north poles N are arranged opposite each other.

Using the third decoupling elements 254, 256, parallelogram guidance can be implemented. To achieve zero stiffness, as explained above, in the horizontal direction, this parallelogram guidance is combined with the pairs of magnetic elements 274, 282. Using the pairs of magnetic elements 274, 282, coupling of the intermediate frame 202 to the force frame 102 can be prevented. Otherwise, the operation of the system 100C corresponds to the operation of the system 100A.

Although the present disclosure has been described with reference to exemplary embodiments, it is modifiable in various ways.

LIST OF REFERENCE SIGNS

1 Projection exposure apparatus
2 Illumination system
3 Light source
4 Illumination optical unit
5 Object field
6 Object plane
7 Reticle
8 Reticle holder
9 Reticle displacement drive
10 Projection optical unit
11 Image field
12 Image plane

13 Wafer
14 Wafer holder
15 Wafer displacement drive
16 Illumination radiation
17 Collector
18 Intermediate focal plane
19 Deflection mirror
20 First facet mirror
21 First facet
22 Second facet mirror
23 Second facet
100A System
100B System
100C System
102 Component/force frame
104 Component/sensor frame
106 Base section
108 Wall section
110 Wall section
112 Arm section
114 Arm section
200A Decoupling device
200B Decoupling device
200C Decoupling device
202 Component/intermediate frame
204 Decoupling element
206 Decoupling element
208 Connection point
210 Connection point
212 Connection point
214 Connection point
216 Decoupling element
218 Decoupling element
220 Decoupling element
222 Decoupling element
224 Decoupling element
226 Decoupling element
228 Pair of magnetic elements
230 Pair of magnetic elements
232 Air gap
234 Air gap
236 Arrow
238 Decoupling element
240 Decoupling element
242 Compression rod
244 Compression rod
246 Flexure
248 Flexure
250 Flexure
252 Flexure
254 Decoupling element
256 Decoupling element
258 Flexure
260 Flexure
262 Flexure
264 Flexure
266 Decoupling element
268 Decoupling element
270 Decoupling element
272 Decoupling element
274 Pair of magnetic elements
276 Component
278 Decoupling element
280 Decoupling element
282 Pair of magnetic elements
F216 Force
F218 Force
F222 Force
F222*h* horizontal force component
F222*v* vertical force component
F224 Force
F224*h* horizontal force component
F224*v* vertical force component
F238 Force
F238*h* horizontal force component
F238*v* vertical force component
F240 Force
F240*h* horizontal force component
F240*v* vertical force component
M1 Mirror
M2 Mirror
M3 Mirror
M4 Mirror
M5 Mirror
M6 Mirror
N North pole
S South pole
x x direction
y y direction
z z direction

What is claimed is:

1. A system, comprising:
a first component;
a second component; and
a decoupling device configured to decouple the second component from mechanical excitations of the first component in more than one degree of freedom,
wherein:
the decoupling device comprises first decoupling elements;
each first decoupling element has a positive stiffness;
the decoupling device comprises second decoupling elements;
each second decoupling element has a negative stiffness;
the decoupling device comprises a third component between the first and second components; and
the decoupling device is configured to decouple the second component from mechanical excitations of the first component in six degrees of freedom.

2. The system of claim 1, wherein:
the first decoupling elements comprise spring elements; and
the second decoupling elements comprise members selected from the group consisting of magnetic elements and pretensioned spring elements.

3. The system of claim 2, wherein the second decoupling elements are arranged in pairs.

4. The system of claim 1, wherein the first and second decoupling elements are between the first and third component.

5. The system of claim 1, wherein the second component is suspended on the third component via third decoupling elements, and the third decoupling elements cause a decoupling of the second component from the third component in a horizontal direction.

6. The system of claim 5, wherein the third decoupling elements comprise tension cables.

7. The system of claim 5, wherein the third decoupling elements comprise tension rods, and each tension rod has a positive stiffness.

8. The system of claim 7, further comprising fourth decoupling elements, wherein:

each fourth decoupling element is between the second and third components;

each fourth decoupling element is between the second and first components; and each fourth decoupling element has a negative stiffness.

9. The system of claim 8, wherein the fourth decoupling elements comprise magnetic elements.

10. The system of claim 8, further comprising a fourth component between the first and fourth decoupling elements, wherein the fourth component is decoupled from the first component via fifth decoupling elements.

11. The system of claim 10, wherein the fifth decoupling elements comprise spring elements.

12. The system of claim 1, wherein:

the first decoupling elements are configured so that, upon their deflection, they apply first forces to the third component;

the first forces are oriented counter to a deflection direction of the first decoupling elements;

the second decoupling elements are configured so that, upon their deflection, they apply second forces to the third component;

the second forces are oriented in a deflection direction of the second decoupling elements; and the first and second forces cancel one other out so that the third component is deflectable without force.

13. The system of claim 1, wherein:

the first decoupling elements comprise spring elements;

the second decoupling elements comprise members selected from the group consisting of magnetic elements and pretensioned spring elements; and the first and second decoupling elements are between the first and third component.

14. The system of claim 1, wherein the second component is suspended on the third component via third decoupling elements, and the third decoupling elements cause a decoupling of the second component from the third component in a horizontal direction.

15. The system of claim 1, wherein:

the first decoupling elements comprise spring elements;

the second decoupling elements comprise members selected from the group consisting of magnetic elements and pretensioned spring elements;

the second component is suspended on the third component via third decoupling elements; and the third decoupling elements cause a decoupling of the second component from the third component in a horizontal direction.

16. The system of claim 1, wherein:

the first decoupling elements comprise spring elements;

the second decoupling elements comprise members selected from the group consisting of magnetic elements and pretensioned spring elements the first decoupling elements are configured so that, upon their deflection, they apply first forces to the third component;

the first forces are oriented counter to a deflection direction of the first decoupling elements;

the second decoupling elements are configured so that, upon their deflection, they apply second forces to the third component;

the second forces are oriented in a deflection direction of the second decoupling elements; and the first and second forces cancel one other out so that the third component is deflectable without force.

17. The system of claim 1, wherein:

the first and second decoupling elements are between the first and third component;

the first decoupling elements are configured so that, upon their deflection, they apply first forces to the third component;

the first forces are oriented counter to a deflection direction of the first decoupling elements;

the second decoupling elements are configured so that, upon their deflection, they apply second forces to the third component;

the second forces are oriented in a deflection direction of the second decoupling elements; and the first and second forces cancel one other out so that the third component is deflectable without force.

18. The system of claim 1, wherein:

the second component is suspended on the third component via third decoupling elements, and the third decoupling elements cause a decoupling of the second component from the third component in a horizontal direction;

the first decoupling elements are configured so that, upon their deflection, they apply first forces to the third component;

the first forces are oriented counter to a deflection direction of the first decoupling elements;

the second decoupling elements are configured so that, upon their deflection, they apply second forces to the third component;

the second forces are oriented in a deflection direction of the second decoupling elements; and the first and second forces cancel one other out so that the third component is deflectable without force.

19. The system of claim 18, wherein the first and second decoupling elements are between the first and third component.

20. An apparatus, comprising:

a system according to claim 1, wherein the apparatus is a lithography projection exposure apparatus.

* * * * *